US006326687B1

(12) United States Patent
Corisis

(10) Patent No.: US 6,326,687 B1
(45) Date of Patent: *Dec. 4, 2001

(54) IC PACKAGE WITH DUAL HEAT SPREADERS

(75) Inventor: David J. Corisis, Meridian, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,339

(22) Filed: Sep. 1, 1998

(51) Int. Cl.⁷ .................................................. H01L 23/34
(52) U.S. Cl. ........................ 257/713; 257/686; 257/706; 257/723; 361/709; 361/711; 361/716
(58) Field of Search .................................... 438/122, 107; 257/712, 713, 276, 719, 723, 675, 686, 730, 685, 687, 659, 660, 704–708, 729, 787, 796; 29/830, 856; 361/709, 716, 711

(56) References Cited

U.S. PATENT DOCUMENTS

| Re. 34,794 | * | 11/1994 | Farnworth | 257/678 |
|---|---|---|---|---|
| 4,024,570 | | 5/1977 | Hartmann et al. | 257/692 |
| 4,143,456 | | 3/1979 | Inoue | 29/588 |
| 4,209,798 | * | 6/1980 | Beretta | 257/712 |
| 4,264,917 | | 4/1981 | Ugon | 257/668 |
| 4,300,153 | | 11/1981 | Hayakawa et al. | 257/668 |
| 4,323,914 | | 4/1982 | Berndlmaier et al. | 257/713 |
| 4,358,552 | | 11/1982 | Shinohara et al. | 523/443 |
| 4,507,675 | | 3/1985 | Fujii et al. | 257/670 |
| 4,642,671 | | 2/1987 | Rohsler et al. | 257/712 |
| 4,688,077 | * | 8/1987 | Wakabayashi et al. | 257/713 |
| 4,801,998 | | 1/1989 | Okuaki | 257/681 |
| 4,931,852 | | 6/1990 | Brown et al. | 257/786 |

(List continued on next page.)

FOREIGN PATENT DOCUMENTS

| 52-77684 | | 6/1977 | (JP). |
|---|---|---|---|
| 60-94744 | | 5/1985 | (JP). |
| 60-178651 | | 9/1985 | (JP). |
| 60-180150 | * | 9/1985 | (JP). |
| 63-187652 | * | 8/1988 | (JP). |
| 41-57758 | | 5/1992 | (JP). |
| 40-5074991 A | * | 3/1993 | (JP). |
| 40-6097365 A | * | 4/1994 | (JP). |
| 40-6216284 A | * | 8/1994 | (JP). |

Primary Examiner—Olik Chaudhuri
Assistant Examiner—Alonzo Chambliss
(74) Attorney, Agent, or Firm—TraskBritt

(57) ABSTRACT

An integrated circuit device has a heat spreader attached to each of the major outer encapsulant surfaces. One or both of the heat spreaders has a pair of end posts configured for insertion into through-holes in a substrate to position and support the device during and following the outer lead solder reflow step at board assembly. The heat spreaders provide high heat dissipation and EMR shielding, and may be connected to the substrate ground to become ground planes.

106 Claims, 10 Drawing Sheets

U.S. PATENT DOCUMENTS

| | | | |
|---|---|---|---|
| 4,961,107 | 10/1990 | Geist et al. | 257/675 |
| 5,051,275 | 9/1991 | Wong | 427/58 |
| 5,101,465 | 3/1992 | Murphy | 385/88 |
| 5,144,747 | 9/1992 | Eichelberger | 29/839 |
| 5,173,764 | 12/1992 | Higgins, III | 257/669 |
| 5,194,930 | 3/1993 | Papathomas et al. | 257/773 |
| 5,214,845 | 6/1993 | King et al. | 29/841 |
| 5,233,220 | 8/1993 | Lamson et al. | 257/666 |
| 5,279,029 * | 1/1994 | Burns | 438/107 |
| 5,311,060 | 5/1994 | Rostoker et al. | 257/796 |
| 5,349,235 * | 9/1994 | Lee et al. | 257/723 |
| 5,377,077 * | 12/1994 | Burns | 361/704 |
| 5,378,924 | 1/1995 | Liang | 257/675 |
| 5,379,186 | 1/1995 | Gold et al. | 361/706 |
| 5,379,187 | 1/1995 | Lee et al. | 361/707 |
| 5,387,554 | 2/1995 | Liang | 438/122 |
| 5,394,303 | 2/1995 | Yamaji | 361/749 |
| 5,413,970 * | 5/1995 | Russell | 438/127 |
| 5,420,751 * | 5/1995 | Burns | 361/707 |
| 5,434,105 | 7/1995 | Liou | 438/122 |
| 5,436,203 | 7/1995 | Lin | 438/126 |
| 5,446,620 * | 8/1995 | Burns et al. | 361/704 |
| 5,450,283 | 9/1995 | Lin et al. | 361/704 |
| 5,457,071 * | 10/1995 | Dombroski | 438/122 |
| 5,488,254 | 1/1996 | Nishimura et al. | 257/707 |
| 5,489,538 | 2/1996 | Rostoker et al. | 438/15 |
| 5,489,801 | 2/1996 | Blish, II | 257/675 |
| 5,541,446 | 7/1996 | Kierse | 257/666 |
| 5,543,664 * | 8/1996 | Burns | 257/787 |
| 5,550,711 * | 8/1996 | Burns et al. | 361/728 |
| 5,552,635 | 9/1996 | Kim et al. | 257/706 |
| 5,559,306 | 9/1996 | Mahulikar | 174/52.4 |
| 5,566,051 * | 10/1996 | Burns | 361/704 |
| 5,592,019 * | 1/1997 | Ueda et al. | 257/675 |
| 5,594,282 | 1/1997 | Otsuki | 257/796 |
| 5,596,231 | 1/1997 | Combs | 257/776 |
| 5,598,034 | 1/1997 | Wakefield | 257/706 |
| 5,619,067 * | 4/1997 | Sua et al. | 257/723 |
| 5,641,997 | 6/1997 | Ohta et al. | 257/788 |
| 5,656,857 | 8/1997 | Kishita | 257/690 |
| 5,659,952 | 8/1997 | Kovac et al. | 29/840 |
| 5,701,034 | 12/1997 | Marrs | 257/706 |
| 5,815,371 * | 9/1998 | Jeffries et al. | 257/719 |
| 5,891,759 * | 4/1999 | Otsuki | 438/122 |
| 6,025,642 * | 2/2000 | Burns | 257/686 |
| 6,048,744 * | 4/2000 | Corisis et al. | 438/15 |
| 6,049,123 * | 4/2000 | Burns | 257/686 |

\* cited by examiner

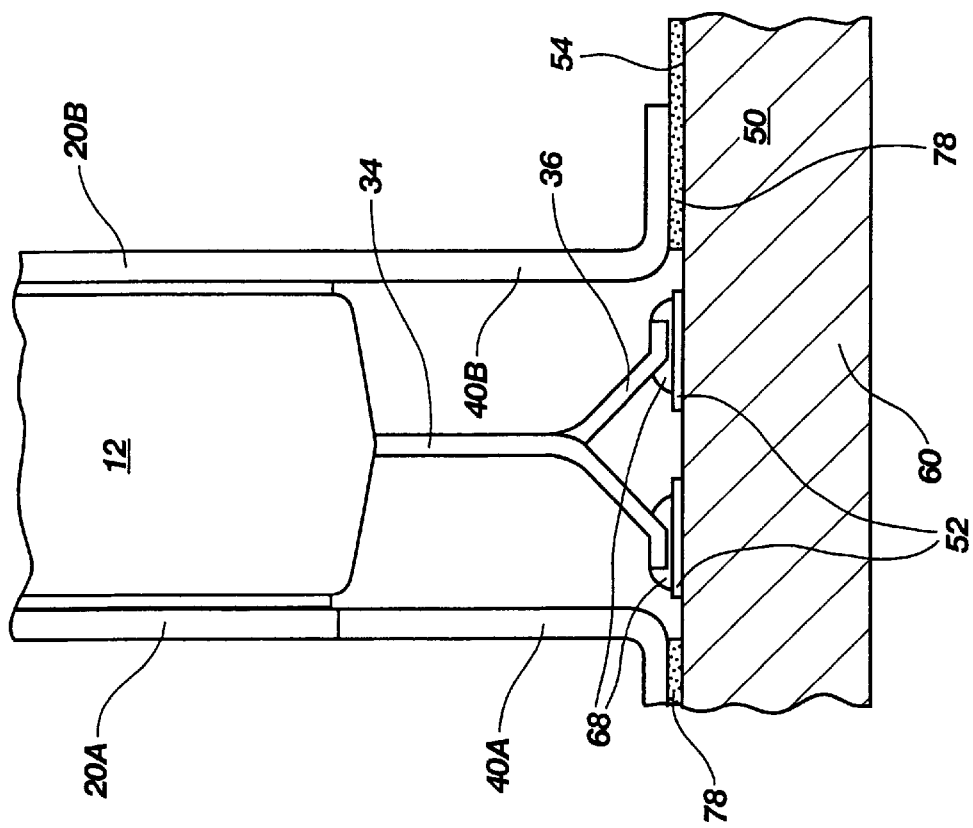
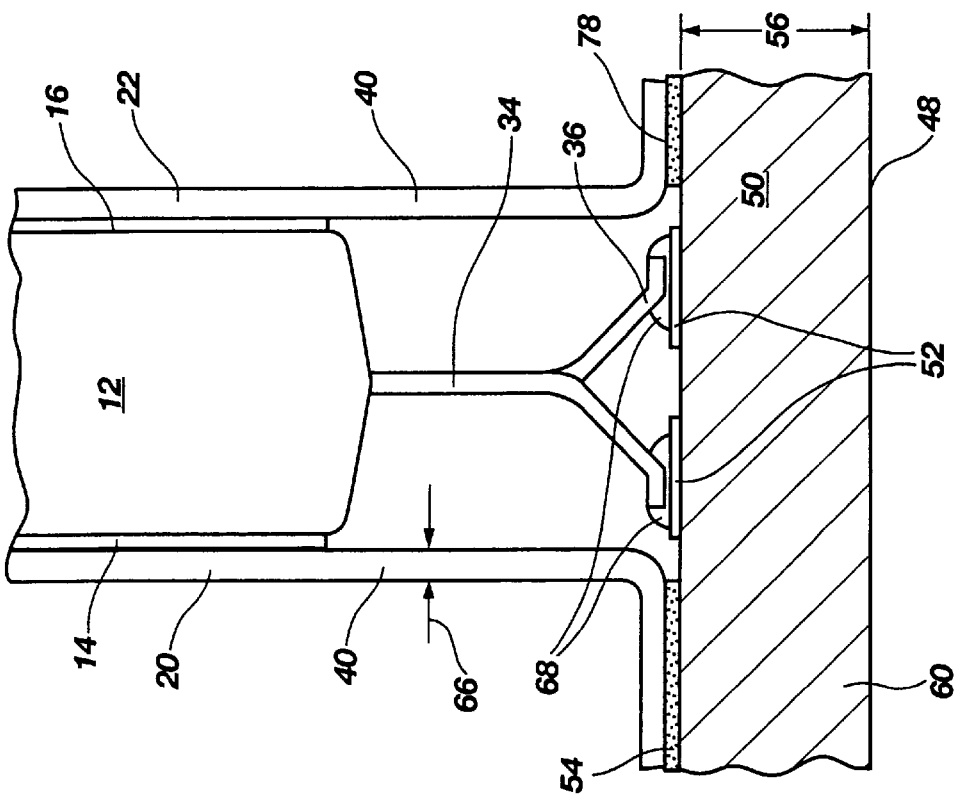

IC PACKAGE WITH DUAL HEAT SPREADERS

BACKGROUND OF THE INVENTION

1. Field of the Invention

This invention relates generally to integrated circuit (IC) devices or semiconductor devices. More particularly, the invention pertains to heat spreading apparatus and methods for dissipating heat from integrated circuit devices or semiconductor devices.

2. State of the Art

Integrated circuit semiconductor devices (IC's) or semiconductor devices are devices including small electronic circuits formed on the surface of a wafer of semiconductor material such as silicon. The IC's or semiconductor devices are fabricated in a plurality on the surface or as part of a wafer. The wafer is then subdivided into discrete IC or semiconductor device chips or dice, and then further tested and assembled for customer use through various well-known individual die testing and packaging techniques, including lead frame packaging, Chip-On-Board (COB) packaging, and flip-chip packaging (FCP). Depending upon the size of the IC or semiconductor device and the size of the wafer, a wafer may be divided into a few dice or as many as several hundred or more than one thousand discrete dice. The discrete IC or semiconductor device may be subsequently packaged in a variety of manners using lead frames, substrates, etc.

Higher powered, faster integrated circuits and/or semiconductor devices generate heat which, if not dissipated, may overheat the IC and/or semiconductor device, resulting in its failure.

Various means for dissipating heat from IC's and semiconductor devices have been used or proposed. Heat transfer through the metallic leadframe or other conducting wire has been enhanced in different ways, as shown in U.S. Pat. No. 5,541,446 of Kierse, U.S. Pat. No. 4,961,107 of Geist et al., U.S. Pat. No. 5,101,465 of Murphy, U.S. Pat. No. 4,264,917 of Ugon, and U.S. Pat. No. 5,656,857 of Kishita.

U.S. Pat. No. 5,450,283 of Lin et al. discloses a device in which the die surface is left unencapsulated in the packaging step, for improved heat dissipation.

Use of an encapsulant composition having enhanced heat conducting properties is shown in U.S. Pat. No. 4,358,552 of Shinohara et al., U.S. Pat. No. 4,507,675 of Fujii et al., U.S. Pat. No. 4,931,852 of Brown et al., and Japanese Patent Application No. 58-202429 of Tanaka. U.S. Pat. No. 5,379,186 of Gold et al. discloses a package comprising inner and outer layers of encapsulant with an intermediate layer of thermally conductive material.

A die support member to which the die is adhesively attached has been used as a heat sink in a variety of configurations. Examples of such are shown in U.S. Pat. No. 5,701,034 of Marrs, U.S. Pat. No. 5,379,187 of Lee et al., U.S. Pat. No. 5,594,282 of Otsuki, U.S. Pat. No. 5,596,231 of Combs, U.S. Pat. No. 5,598,034 of Wakefield, U.S. Pat. No. 4,642,671 of Rohsler et al., U.S. Pat. No. 5,434,105 of Liou, U.S. Pat. No. 5,488,254 of Nishimura et al., U.S. Pat. No. 5,659,952 of Kovak et al., and U.S. Pat. No. 5,489,801 of Blish II.

A single plate of metallic material has been applied to the outside of the package as a heat sink. Such is shown in U.S. Pat. No. 5,552,635 of Kim et al., U.S. Pat. No. 5,173,764 of Higgins III, and U.S. Pat. No. 4,024,570 of Hartmann et al.

In U.S. Pat. Nos. 5,378,924 and 5,387,554 of Liang, a layer of thermal grease is inserted between the die and a heat sink.

U.S. Pat. No. 5,144,747 of Eichelberger, U.S. Pat. No. 5,311,060 of Rostoker et al., and U.S. Pat. No. 5,641,997 of Ohta et al. show IC devices with separate heat sinks within the encapsulant near a wall thereof.

U.S. Pat. No. 4,323,914 of Berndlmaier et al. teaches a heat transfer structure comprising a pool of liquid metal adjacent a parylene-covered die in a semiconductor device.

Various patents show the use of flat and non-flat metal conductors for reducing power-ground loop inductance and increasing capacitance to reduce noise and increase operational speed. See, for example, U.S. Pat. No. 5,214,845 of King et al., U.S. Pat. No. 5,559,306 of Mahulikar, U.S. Pat. No. 5,233,220 of Lamson et al., U.S. Pat. No. 5,436,203 of Lin, and Japanese Patent Application No. 60-178651 of Uno. None of these documents mentions heat dissipation.

The various methods of heat dissipation require, in general, complex structures. Routes for moisture leakage into the package result from heat spreaders/sinks which are partially exposed. A new heat spreader construction is needed for producing an integrated circuit device with high heat removal rates protection against electronic noise and spikes, all at low cost and minimum time expenditure, and without problems of leakage.

BRIEF SUMMARY OF THE INVENTION

The invention comprises a vertical mount integrated circuit (IC) or semiconductor device with dual heat spreaders. The planar heat spreaders are adhesively attached to the opposed major surfaces of the package encapsulant. One or both of the heat spreaders has one or more through-hole posts projecting outwardly to be inserted into through-holes in a substrate. When inserted, the posts align the exterior leads of the device with corresponding leads on the substrate for accurate bonding therebetween. One or both of the heat spreaders may be connected to a ground bus to act as a ground plane.

The heat spreaders of the invention provide enhanced heat dissipation, shielding of the integrated circuit(s) of the IC and/or semiconductor device, and mitigation of transient voltage excursions. The invention is particularly applicable to a vertical mount package which is to be bonded by solder reflow to a substrate such as a circuit board.

BRIEF DESCRIPTION OF THE DRAWINGS

The invention is illustrated in the following exemplary figures, wherein the drawings are not necessarily to scale.

FIG. 7A is a partial cross-sectional view of an IC or semiconductor device of a second embodiment of the invention mounted on a substrate if the cross-section of such invention were taken along line 7—7 of FIG. 1;

FIG. 8A is a partial cross-sectional view of another IC or semiconductor device of the second embodiment of the invention mounted on a substrate, as taken along line 8—8 of FIG. 6.

DESCRIPTION OF THE ILLUSTRATED EMBODIMENTS

Figure 1:
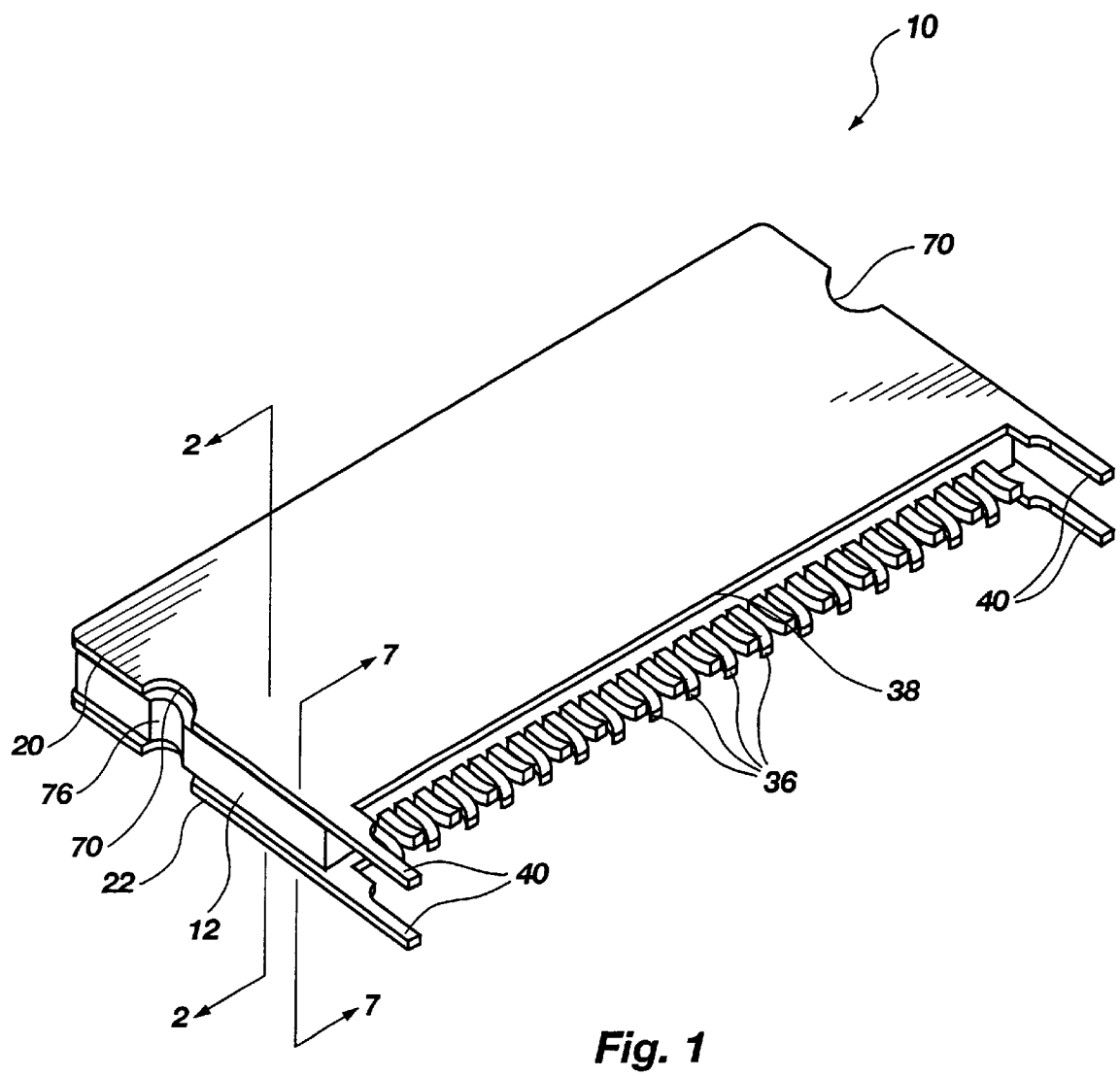
FIG. 1 is a perspective view of a vertical mount IC or semiconductor device having dual heat spreaders of the invention.

One embodiment of the invention is illustrated in drawing FIGS. 1 through 3 and described as follows:

The invention comprises an IC or semiconductor device 10 with dual heat spreaders 20, 22, where the heat spreaders "sandwich" the encapsulation material 12 of the IC or semiconductor device. Each heat spreader 20, 22 is fixed to one of the major external surfaces 14, 16 of the encapsulation material 12, and substantially overcovers the major external surface.

In a preferred form, the heat spreaders 20, 22 are joined to the planar major surfaces 14, 16 of the encapsulation material 12 with an adhesive material 18. Preferably, the adhesive material 18 has a relatively high coefficient of thermal conductivity and comprises a thin layer. It is also preferable that the adhesive material 18 has a coefficient of thermal expansion (CTE) intermediate between the CTE's of the encapsulation material 12 and the heat spreaders 20, 22. In another preferred form, the adhesive material 18 has a relatively high degree of elasticity to compensate for differences between heat spreader CTE and encapsulant CTE. An adhesive coated tape formed of e.g. polyimide may be used as adhesive material 18 to join the heat spreaders 20, 22 to the encapsulation material 12.

Figure 2:
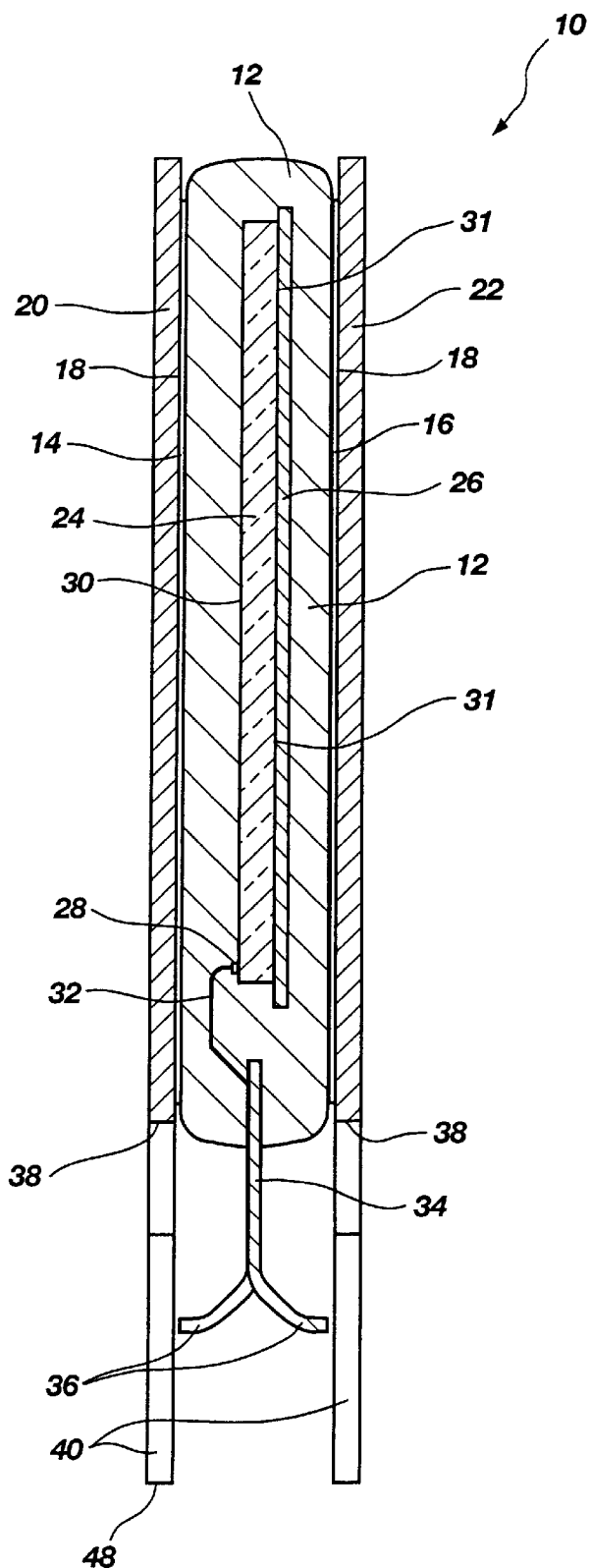
FIG. 2 is a cross-sectional view of an IC or semiconductor device of the invention as taken along line 2—2 of FIG. 1.
Figure 3:
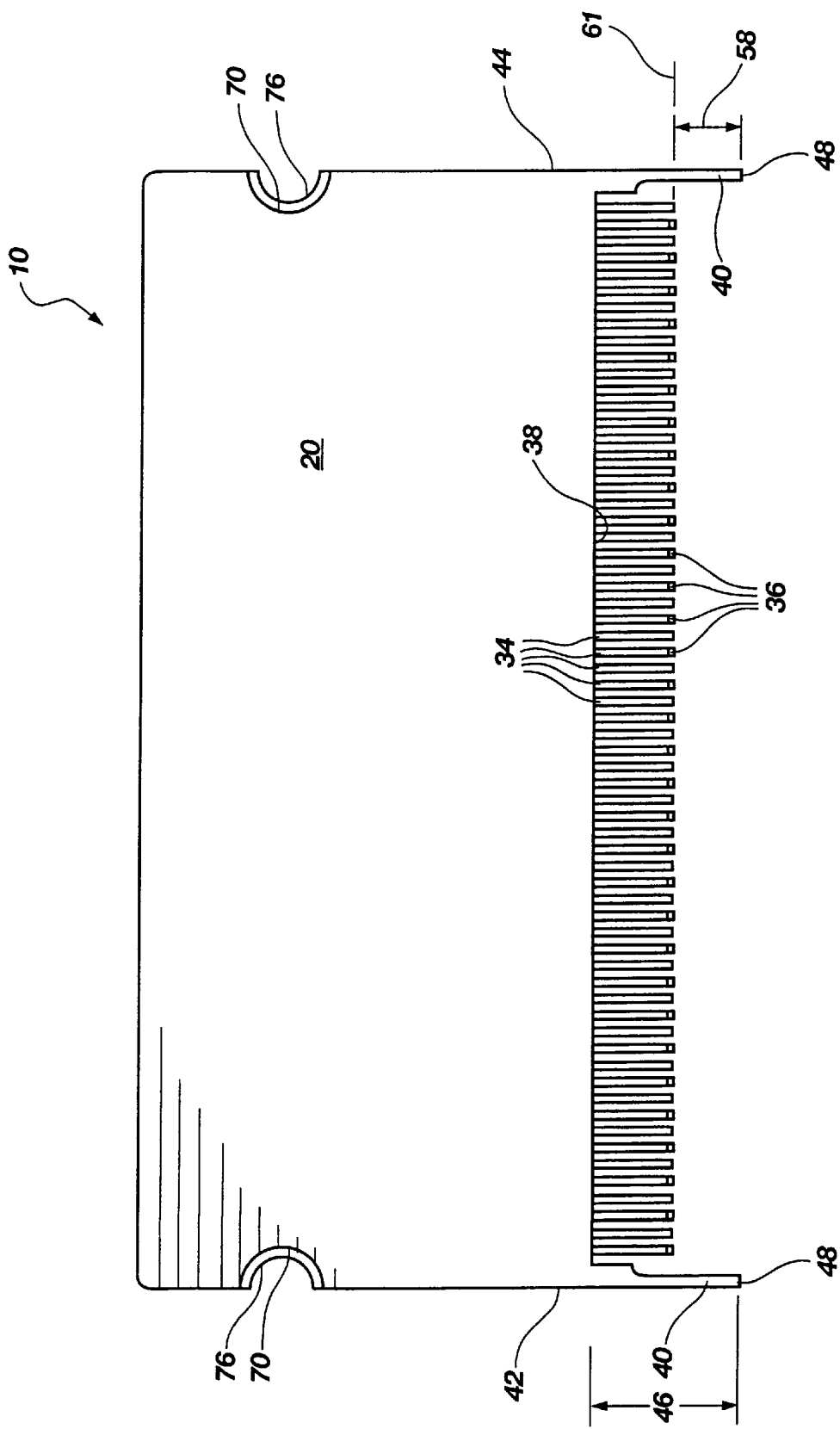
FIG. 3 is a plan view of an IC or semiconductor device of the invention.

An exemplary IC or semiconductor device 10 is depicted in drawing FIG. 2, being based on an integrated circuit die 24 which has its reverse side 31 down-bonded to a lead frame paddle 26. Electrical bond pads 28 on one end of the active surface 30 of die 24 are bonded by conductive wires 32 to lead fingers 34 whose outer ends comprise exterior leads 36 to be connected to conductors on a substrate (not shown in drawing FIGS. 1–3). Both the active surface 30 and the reverse side 31 comprise generally parallel major surfaces of the die 24.

As will become apparent from the description, the application of heat spreaders in accordance with the invention may be accomplished regardless of the particular IC or semiconductor device configuration.

As shown in drawing FIGS. 1–3 and 7, the heat spreaders 20, 22 are thin planar members or plates formed to substantially overcover the package of encapsulation material 12. A pair of through-hole posts 40 is formed as part of each heat spreader 20, 22, spaced along what will be known herein as the lead edge 38 of the heat spreader. The lead edge 38 is defined as the heat spreader edge proximate the exterior leads 36 of the package. As shown in the figures, the through-hole posts 40 extend outward from each heat spreader 20, 22 at each end 42, 44 of the lead edge 38. The through-hole posts 40 may be located at any locations along an edge of the heat spreader 20, 22 where their insertion into a through-hole 60 in a substrate 50 or other body will accurately position and hold the IC or semiconductor device 10 in place for joining the exterior leads 36 to other leads, for example, by solder reflow to surface conductive traces 52 of a substrate 50. Alternately, as illustrated in drawing FIG. 2A, the through-hole posts 40 extend downwardly and outwardly from each heat spreader 20, 22 at each end 42, 44 of the lead edge 38 for connection to a suitable substrate (not shown) by adhesive bonding, reflow soldering, etc. In these drawings, the substrate 50 is exemplified as a circuit board with a thickness 56 and with surface conductive traces 52 on its upper surface 54. In the substrate 50, through-holes 60 are positioned relative to the surface conductive traces 52 so that precise positioning (and maintenance of the position) of the IC device 10 for lead the attachment is readily accomplished.

The through-holes 60 are most easily formed by drilling. The hole diameter 62 is based on the size of the through-hole posts 40, permitting a snug or interference fit therebetween. The minimum cross-sectional dimensions of the through-hole posts 40 depend upon the strength of the heat spreader material. Once the IC device 10 is attached to the substrate 50, the presence of the through-hole posts 40 adds much stability. If desired, additional stability may be attained by inserting a fast curing adhesive material 64 into the through-holes 60 surrounding the through-hole posts 40. The adhesive material 64 may be any of a wide variety of organic adhesives, as known in the art. A similar type adhesive material 64 may be used to bond through-hole posts 40, as illustrated in drawing FIG. 2A, to the substrate 50 to attach the through-hole posts 40 thereto.

Figure 2A:
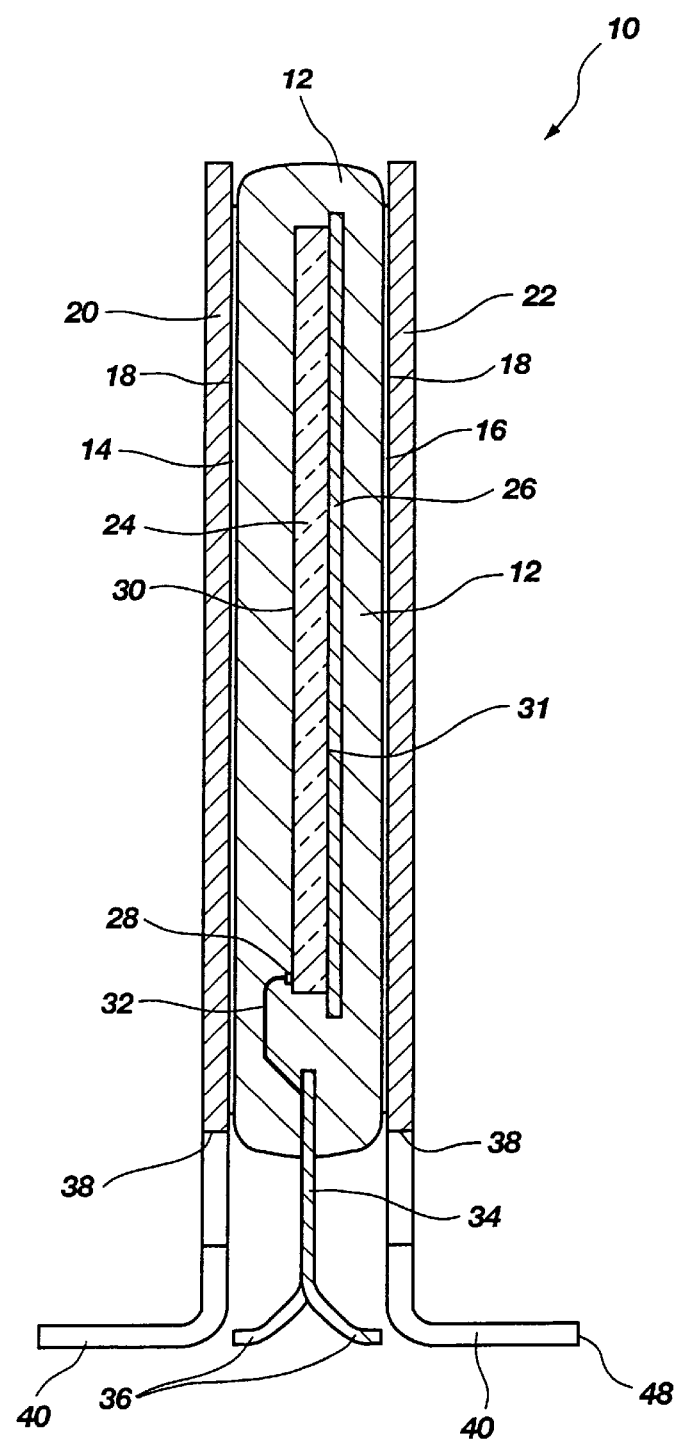
FIG. 2A is a cross-sectional view of a second embodiment of an IC or semiconductor device of such invention if taken along line 2—2 of FIG. 1.

Referring to drawing FIG. 2A, an alternative IC or semiconductor device 10 is depicted such as in drawing FIG. 2, being based on an integrated circuit die 24 which has its reverse side 31 down-bonded to a lead frame paddle 26. Electrical bond pads 28 on one end of the active surface 30 of die 24 are bonded by conductive wires 32 to lead fingers 34 whose outer ends comprise exterior leads 36 to be connected to conductors on a substrate (not shown in drawing FIGS. 1–3). Both the active surface 30 and the reverse side 31 comprise generally parallel major surfaces of the die 24.

As shown in drawing FIGS. 1–3 and 7A, the heat spreaders 20, 22 are thin planar members or plates formed to substantially overcover the package of encapsulation material 12. A pair of through-hole posts 40 is formed as part of each heat spreader 20, 22, spaced along what will be known herein as the lead edge 38 of the heat spreader. The lead edge 38 is defined as the heat spreader edge proximate the exterior leads 36 of the package. As shown in the figures, the through-hole posts 40 extend downwardly and outwardly away from each heat spreader 20, 22 at each end 42, 44 of the lead 38. The through-hole posts 40 may be located at any locations along an edge of the heat spreader 20, 22 where they are available for subsequent mounting on a substrate 50 or other body which will accurately position and hold the IC or a semiconductor device 10 in place to a substrate 50 or for joining the external leads 36 to other leads, for example, by solder reflow to surface traces 52 and 78 of a substrate 50. In these drawings, the substrate 50 is exemplified as a circuit board which may include surface conductive traces 52 and 78 on its upper surface 54.

Figure 5:
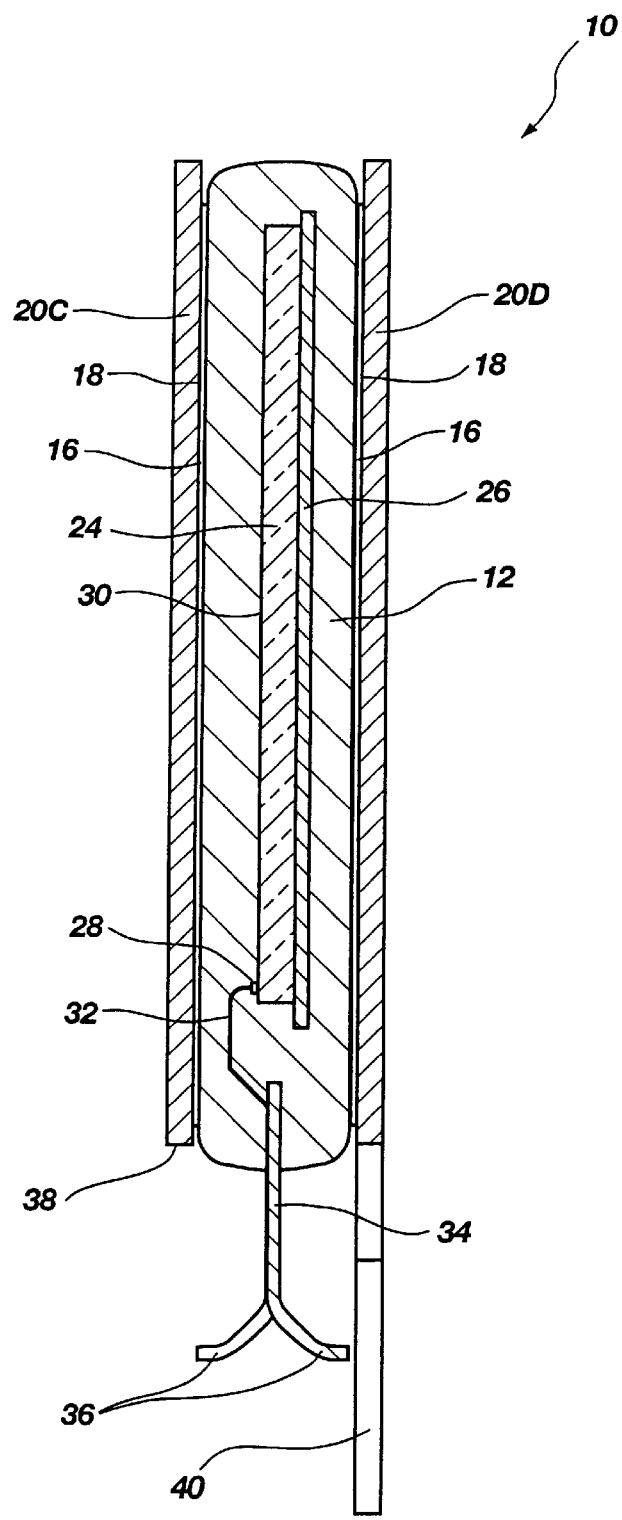
FIG. 5 is a cross-sectional view of another embodiment of an IC or semiconductor device of the invention, as taken along line 5—5 of FIG. 4.

As shown in drawing FIG. 5, the through-hole posts 40 may be made of a length 46 such that the post ends 48 extend completely along a desired length of the substrate 50, as shown in FIGS. 2A and 7A.

The through-hole posts 40 may be of any cross-sectional shape or thickness suitable for use on the substrate 50. Typically, the through-hole posts 40 are formed to have a square or near-square cross-section having a maximum dimension approximately equal to the thickness 66 of the heat spreader 20.

Figure 7:
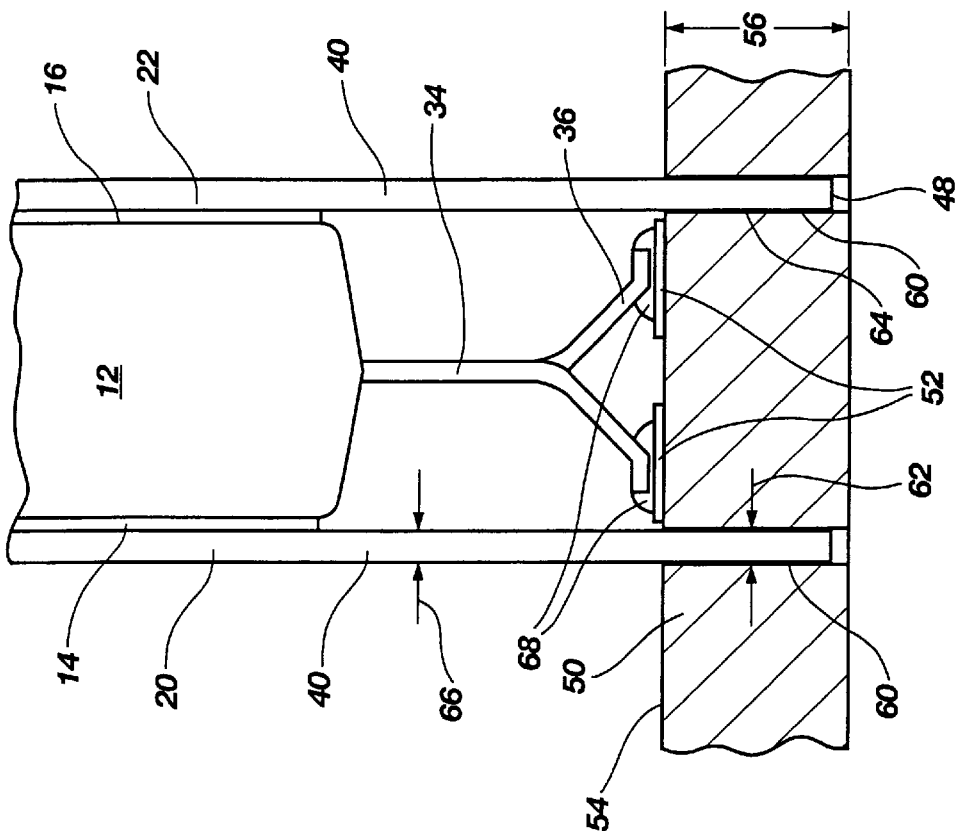
FIG. 7 is a partial cross-sectional view of an IC or semiconductor device of the invention mounted on a substrate as taken along line 7—7 of FIG. 1.

In FIG. 7, the exterior leads 36 are shown bonded by reflow of solder 68 to surface traces 52 on the upper surface 54 of the substrate 50.

Referring to drawing FIG. 7A, a lower portion of a through-hole post 40 is bonded to a lead or circuit 78 on the substrate 50 while the other through-hole post 40 is adhesively secured to the surface of the substrate 50. If desired, both through-hole posts 40 may be reflow soldered to circuits 78 on substrate 50 or both adhesively bonded to the surface of the substrate 50.

Referring back to FIGS. 1 and 3, the heat spreaders 20,22 are shown with semicircular cutouts 70 which together comprise means for precisely registering the spreaders on the encapsulation material 12. They are shown on each heat spreader 20, 22 as semicircular cutouts aligned with cutouts 76 in the encapsulation material 12. The cutouts 70 permit the use of automated machinery for heat spreader placement. The particular registration means may vary, depending upon the particular manipulation apparatus which is used.

Figure 4:
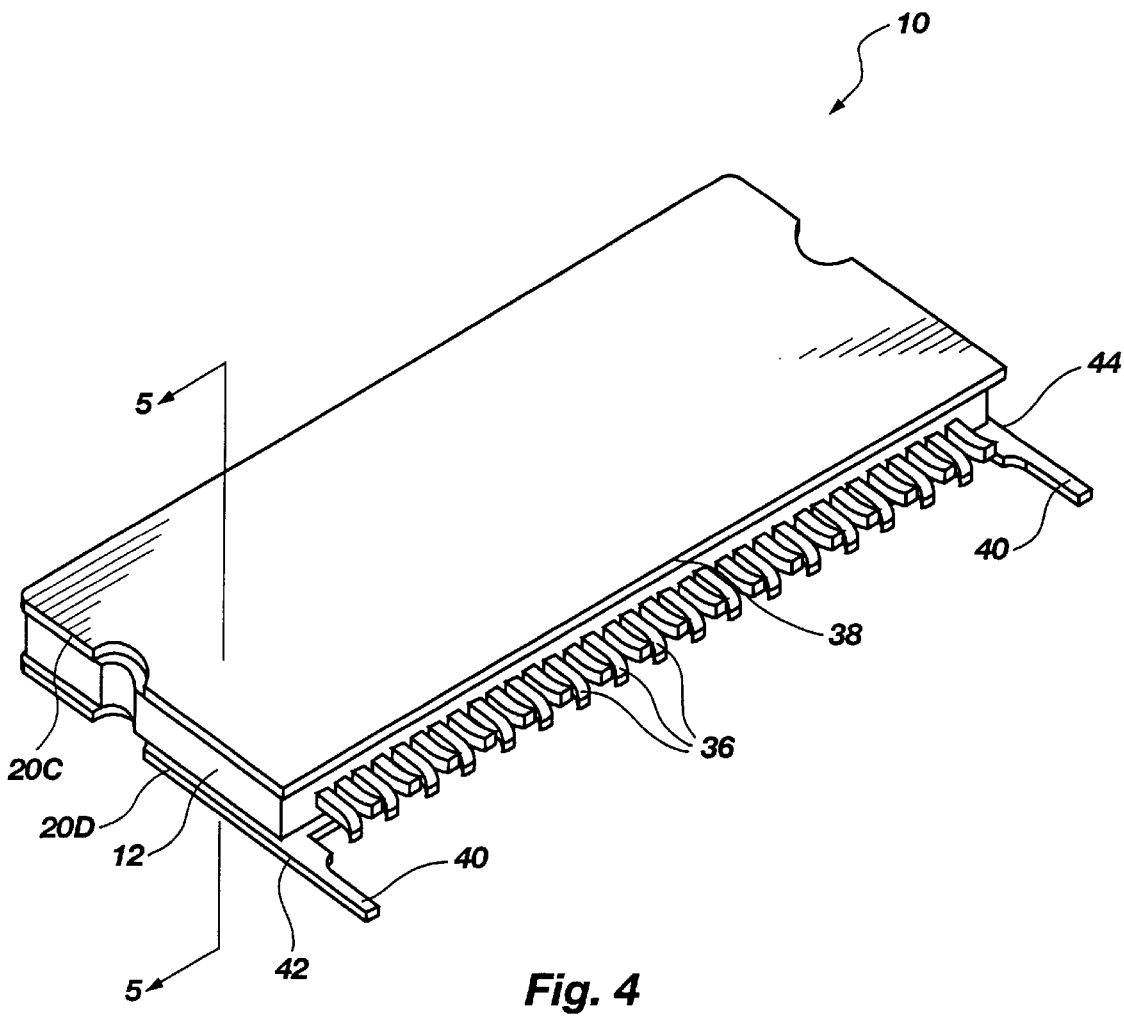
FIG. 4 is a perspective view of a vertical mount IC or semiconductor device having another embodiment of dual heat spreaders of the invention.

Turning now to FIGS. 4 and 5, another form of the invention is shown as having a pair of heat spreaders. A first heat 20C is formed with no through-hole posts 40, while a second heat spreader 20D has two end-positioned through-hole posts 40. Thus, the completed IC device 10 has two through-hole posts 40, one at each end 42, 44 of the lead edge 38. Only two through-holes 60 in the substrate 50 are needed to accurately position the IC device 10 thereon for lead attachment.

Figure 6:
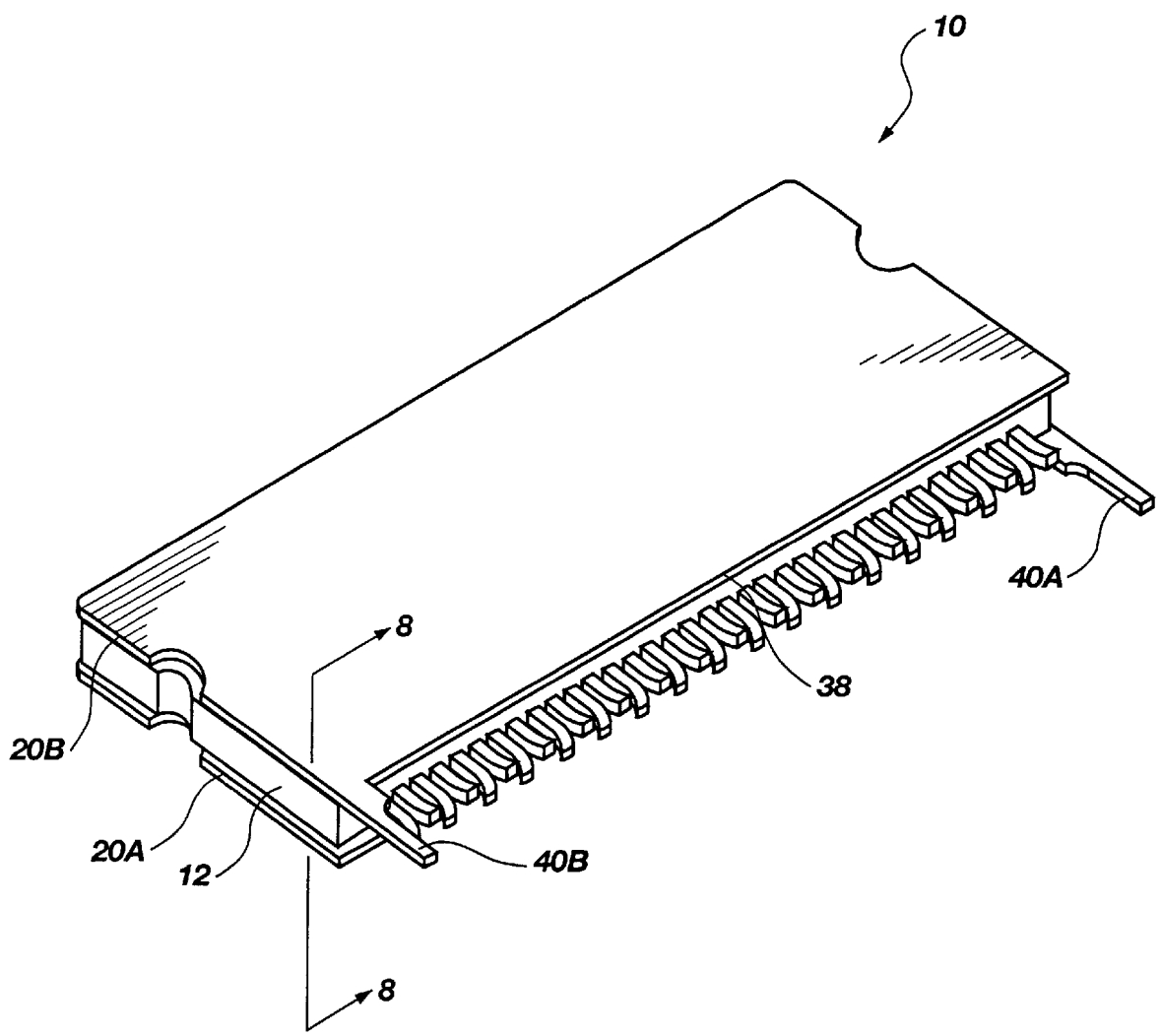
FIG. 6 is a perspective view of a vertical mount IC or semiconductor device having another embodiment of dual heat spreaders of the invention.
Figure 8:
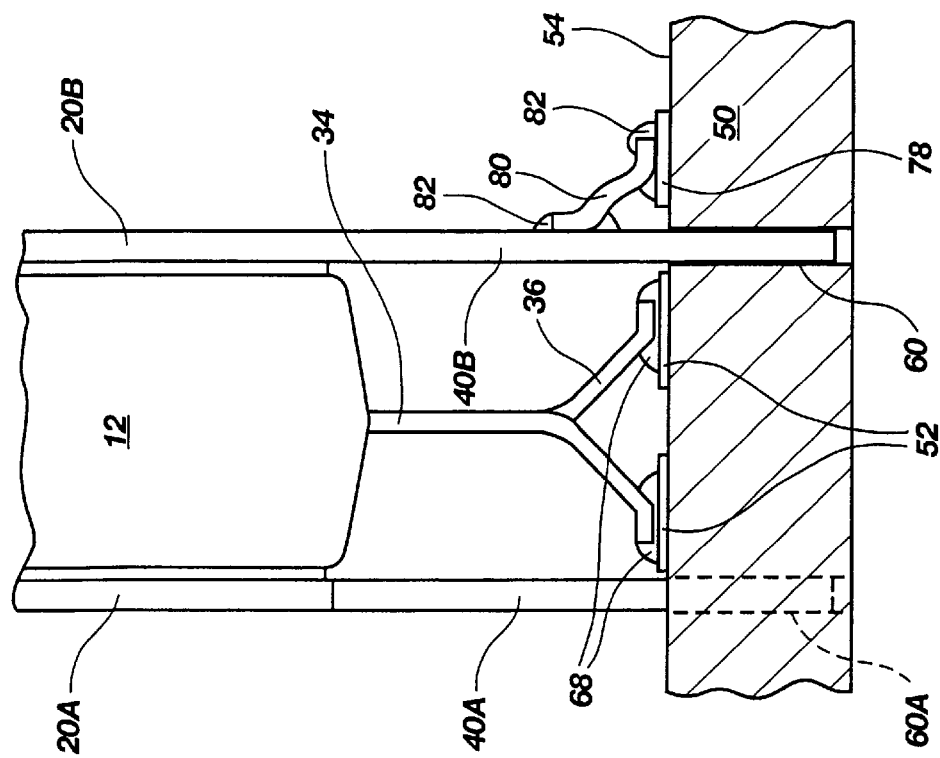
FIG. 8 is a partial cross-sectional view of another IC or semiconductor device of the invention mounted on a substrate, as taken along line 8—8 of FIG. 6.

A further form of the IC device 10 is depicted in FIGS. 6 and 8, where each heat spreader 20A, 20B has one through-hole post 40A, 40B, respectively. The two heat spreaders 20A, 20B are in fact identical, but are in an inverse position relative to each other. Like the embodiment of FIG. 4, only two through-holes 60, 60A are required in the substrate 50 to mount the IC device 10.

In FIG. 8, the exterior leads 36 are shown bonded by reflow of solder 68 to surface traces 52 on the upper surface 54 of the substrate 50.

As shown in FIG. 8, one of the heat spreaders, i.e. 20B, is configured as a ground plane by e.g. connecting it to a ground lead 78 with a conductor 80 with solder connections 82.

In drawing FIG. 8A, the exterior leads 36 are shown bonded by reflow of solder 68 to surface traces 52 on the upper surface 54 of the substrate 50 while heat spreaders 20A and 20B are shown bonded by reflow of solder to leads or circuit traces 78 on substrate 50, thereby allowing the use of the heat spreaders 20A and 20B as ground planes when the leads or circuits 78 are grounded.

In each of the embodiments, the heat spreaders 20, 22 may be formed of various materials including a metal such as aluminum or a copper alloy, a metal filled polymer having enhanced heat conductivity, or a ceramic for example. The preferred material is a metal because of its resistance to breakage and high heat conductivity. Thus, the through-hole posts 40 may have smaller dimensions and the through-holes 60 may have a smaller diameter. The thickness 66 of the heat spreaders 20 may be any suitable thickness for use as a heat spreader.

Figure 9:
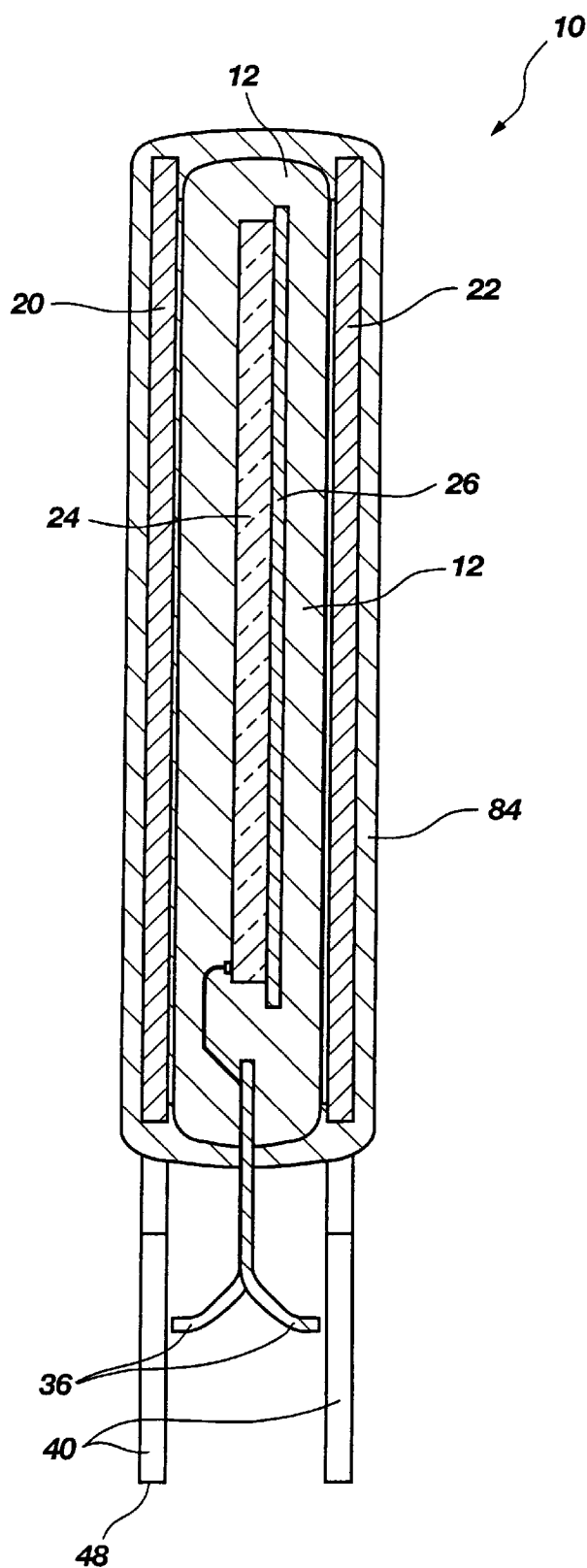
FIG. 9 is a cross-sectional view of an IC or semiconductor device of the invention having encapsulated heat spreaders.

Fi desired, the device 10 may be encapsulated a second time, following bounding of the heat spreaders 20, 22 to the initial encapsulation material 12. As shown in FIG. 9, the second layer 84 of encapsulant may be the same as, or different from, the encapsulation material 12 of the first encapsulation step. This second encapsulation step may comprise injection in a mold, for example, or simply overlaying an encapsulant on the surface, since there are no interior spaces into which encapsulant must be injected.

The advantages of the IC device 10 as described are many. First, the dissipation rate of thermal energy is very high. The heat spreaders 20, 22 provide a high degree of protection of the IC device 10 during reflow connection of the exterior leads 36 to a substrate 50.

Second, precise positioninng of the IC device 10 for attachment to a substrate is made easier and consistent by use of the through-hole posts 40. Two or less through-holes 60 may be used to provide accurate bonding.

Third, the post-bond stability of the IC device 10 on the substrate 50 is increased, lessening the possibility of damage to the device. The stability may be further enhanced by simple application of an adhesive, reflow solder, etc.

Fourth, the heat spreaders 20, 22 may be easily connected to a ground bus to provide a ground plane or planes for the device. The effects of transient voltage excursions are reduced or eliminated.

Fifth, shielding of the device by metal heat spreaders 20, 22 also provides protection from lead inductance effects.

The heat spreaders are easily formed and easily applied to the device, using readily available materials. Their use does not introduce leakage paths by which destructive moisture and gases may penetrate the interior of the package.

Additional advantages and modifications will readily be recognized by those skilled in the art. Therefore, the invention in its broader aspects is not limited to the specific details, and representative devices, shown and described herein. Accordingly, various modifications may be made without departing from the spirit or scope of the general inventive concept and embodiments as defined by the appended claims and their equivalents.

What is claimed is:

1. A semiconductor device package, comprising:

a semiconductor die having electrical leads connected thereto, said semiconductor die encapsulated in a material forming a package, said package having opposing major external surfaces and having a package edge connecting said opposing major external surfaces and a portion of the electrical leads connected to said semiconductor die extending from said package ends, lead ends of said portion of electrical leads being configured for connection to a substrate, said package configured with register apparatus comprising a recess in at least one peripheral edge of said package, said recess extending to each of said opposing major external surfaces; and two heat spreaders, each of the two heat spreaders contacting at least a portion of said substrate, said heat spreaders having a portion thereof attached to a portion of one of said opposing major external surfaces of said semiconductor die, thereby containing said semiconductor die between a portion of said heat spreaders, said heat spreaders configured to provide essentially a sole structural support for at least one of said electrical leads, said heat spreaders positioned so as to provide an opening between distal end portions of said heat spreaders, said heat spreaders comprising register apparatus on at least one peripheral edge of said heat spreaders for alignment with the register apparatus of said package.

2. The semiconductor device package of claim 1, wherein said electrical leads are configured for vertical mounting of said semiconductor die on said substrate, and at least one of said heat spreaders has at least one through-hole post extending outwardly beyond said lead ends for connection to said substrate.

3. The semiconductor device package of claim 2, wherein one of said heat spreaders has a through-hole post proximate each end of said semiconductor die for connection to said substrate, said substrate having apertures therein.

4. The semiconductor device package of claim 2, wherein a first heat spreader has at least one post proximate a first end of said semiconductor die, and a second heat spreader has at least one post proximate a second end of said semiconductor die.

5. The semiconductor device package of claim 1, wherein each of said heat spreaders substantially covers the attached portion of one of said opposing major external surfaces of said semiconductor die.

6. The semiconductor device package of claim 1, wherein at least one of said heat spreaders is configured for connection to a ground conductor on said substrate.

7. The semiconductor device package of claim 1, wherein said semiconductor die comprises a vertical mount plastic-encapsulated package.

8. The semiconductor device package of claim 1, wherein said register apparatus on said at least one peripheral edge of each of said heat spreaders are configured for machine positionin and attachment of each that spreader on one of said opposing major external surfaces of said package.

9. The semiconductor device package of claim 8, wherein said register apparatus on said at least one peripheral edge of said heat spreaders comprises cutout portion of each of said heat spreaders.

10. The semiconductor device package of claim 1, wherein said heat spreaders are attached to said package with an adhesive.

11. The semiconductor device package of claim 1, wherein said heat spreaders are attached to said package with an adhesive-coated tape.

12. The semiconductor device package of claim 1, wherein said heat spreaders comprise plates, said plates including metal, ceramic material, and plastic material.

13. The semiconductor device package of claim 1, further comprising:
 a second layer of material encapsulating said heat spreaders within said package.

14. A semiconductor device, comprising:
 a semiconductor die encapsulated in material forming a package having two opposing major external surfaces and having a package edge connecting said major external surfaces and electrical leads extending therefrom, wherein lead ends of the electrical leaeds are for attachment to a substrate, said package configured with register apparatus comprising a recess in at least one peripheral edge of said package, said recess extending to each of said opposing major external surfaces; and
 two heat spreaders, each heat spreader having a surface attached to one of said major external surfaces of said package, said each heat spreader contacting at least a portion of said substrate, said package sandwiched between said heat spreaders, said heat spreaders configured to provide essentially the sole structural support for at least one of said electrical leads, said heat spreaders positioned so as to provide an opening between distal end portions of said heat spreaders, said heat spreaders comprising register apparatus on at least one peripheral edge of said heat spreaders for alignment with the register apparatus of said package.

15. The semiconductor device of claim 14, wherein said electrical leads are configured for vertical mounting of said semiconductor die on said substrate, and at least one of said heat spreaders has at least one post extending beyond said lead ends for attachment to said substrate.

16. The semiconductor device of claim 15, wherein one of said heat spreaders has a post proximate each end of said semiconductor die.

17. The semiconductor device of claim 15, wherein a first heat spreader of said heat spreaders has at least one post proximate a first end of said semiconductor die, and a second heat spreader of said heat spreaders has at least one post proximate a second, opposite end of said semiconductor die.

18. The semiconductor device of claim 14, wherein each of said heat spreaders substantially covers said one of the attached two opposing major external surfaces of said package.

19. The semiconductor device of claim 14, wherein at least one of said heat spreaders is configured for attachment to a conductor on said substrate.

20. The semiconductor device of claim 14, wherein said semiconductor device comprises a vertical mount plastic-encapsulated package.

21. The semiconductor device of claim 14, wherein said register apparatus on at least one peripheral edge of each of said heat spreaders are configured for machine positioning and attachment of each heat spreader on one of said two opposing major external surfaces.

22. The semiconductor device of claim 21, wherein said register apparatus comprises cutout portions of each of said heat spreaders.

23. The semiconductor device of claim 14, wherein said heat spreaders are attached to said package with an adhesive.

24. The semiconductor device of claim 14, wherein said heat spreaders are attached to said package with an adhesive-coated tape.

25. The semiconductor device of claim 14, wherein said heat spreaders comprise plates, said plates including metal, ceramic material, and plastic material.

26. The semiconductor device of claim 14, further comprising:
 a second layer of material encapsulating said heat spreaders within said package.

27. A vertical mount semiconductor package, comprising:
 a semiconductor die having opposed major surfaces and circuits formed on one of said opposed major surfaces;
 a die support member attached to the other of said opposed major surfaces of said semiconductor die;
 conductive outer leads along one edge of said semiconductor die between said opposed major surfaces for attachment to a substrate;
 conductive lead members connecting said circuits to said conductor outer leads;
 a material encapsulating portions of said semiconductor die, said die support member, and said conductive lead members, said material forming a package, said package configured with register apparatus comprising a recess in at least one peripheral edge of said package, said recess extending to each of said opposed major surfaces; and thermally conductive plates comprising heat spreaders attached to said material, each thermally conductive plate contacting at least a portion of said substrate, said each thermally conductive plate covering a portion of said material encapsulating said portion of said semiconductor die and configured to provide essentially a sole structural support for at least one of said conductive outer leads, said heat spreaders positioned so as to provide an opening between distal end portions of said heat spreaders, said heat spreaders comprising register apparatus on at least one peripheral edge of each of said heat spreaders for alignment with the register apparatus of said package and for machine positioning and attachment of said heat spreaders on said opposed major surfaces of said package.

28. The vertical mount semiconductor package of claim 27, wherein said heat spreaders are secured to said material encapsulating said portions of said semiconductor die.

29. The vertical mount semiconductor package of claim 27, wherein said heat spreaders are adhesively secured to said material encapsulating said portions of said semiconductor die.

30. The vertical mount semiconductor package of claim 27, wherein said heat spreaders are secured to said material encapsulating said portions of said semiconductor die by an adhesive-coated tape.

31. The vertical mount semiconductor package of claim 27, further comprising:
a second layer of material covering a portion of said heat spreaders.

32. A vertical mount semiconductor package, comprising:
a semiconductor die having opposed major surfaces and circuits formed on one of said opposed major surfaces;
a die support member attached to the other of said opposed major surfaces of said semiconductor die;
conductive outer leads along one edge of said semiconductor die between said opposed major surfaces for attachment to a substrate;
conductive lead members connecting said circuits to said conductive outer leads;
a material encapsulating said semiconductor die, said die support member and said conductive lead members, said material forming a package, said package configured with register apparatus comprising a recess in at least one peripheral edge of said package, said recess extending to each of said opposed major external surfaces; and
thermally conductive plates comprising heat spreaders attached to said material encapsulating said semiconductor die and substantially covering said opposed major surfaces of said semiconductor die, said heat spreaders configured to provide essentially a sole structural support for at least one of said conductive outer leads, said heat spreaders positioned so as to provide an opening between distal end portions of said heat spreaders, said heat spreaders comprising register apparatus on at least one peripheral edge of each of said heat spreaders for alignment with the register apparatus of said package.

33. The vertical mount semiconductor package of claim 32, wherein said heat spreaders are secured to said material encapsulating said semiconductor die.

34. The vertical mount semiconductor package of claim 32, wherein said heat spreaders are secured to said material encapsulating said semiconductor die by an adhesive material.

35. The vertical mount semiconductor package of claim 32, wherein said heat spreaders are secured to said material encapsulating said semiconductor die by an adhesive-coated tape.

36. The vertical mount semiconductor package of claim 32, further comprising:
a second layer of material securing said heat spreaders to said material encapsulating said semiconductor die.

37. A heat spreader apparatus for an encapsulated semiconductor device having a row of exterior leads, a peripheral edge and at least two opposed major surfaces, the encapsulated semiconductor device having a register apparatus in the peripheral edge thereof, comprising:
a plate forming a first heat spreader for covering a portion of one of said at least two opposed major surfaces of said encapsulated semiconductor device, said first heat spreader having a lead edge proximate to said row of exterior leads having at least one post projecting therefrom for securing said encapsulated semiconductor device to a substrate having at least one circuit thereon said firs theat spreader comprising register apparatus on at least one peripheral edge thereof for accurate mounting to one of said at least two opposed major surfaces;
another plate forming heat spreader for covering a portion of a second one of said at least two opposed major surfaces of said encapsulated semiconductor device, said second heat spreader having a lead edge proximate to said row of exterior leads having at least one post projecting therefrom for securing said semiconductor device to said substrate having said at least one circuit thereon, said second heat spreader comprising register apparatus on at least one peripheral edge thereof for accurate mounting to second one of said at least two opposed major surfaces, each of said register apparatus of said first heat spreader and said second heat spreader aligned with the register apparatus of the encapsulated semiconductor device to form a recess extending into the at least two opposed major surfaces and each of said first heat spreader and said second heat spreader; and
wherein said heat spreaders are configured to provide essentially a sole structural support for at least one of said row of exterior leads, said heat spreaders are positioned so as to provide an opening between distal end portions of said heat spreaders, and said at least one post align said row of exterior leads with said at least one circuit on said substrate.

38. The heat spreader apparatus of claim 37, wherein said first heat spreader and said second heat spreader are identical in shape for inverse attachment to said at least two opposed major surfaces.

39. The heat spreader apparatus of claim 40, wherein said at least one post is positioned adjacent one end on each of said first heat spreader and said second heat spreader.

40. The heat spreader apparatus of claim 38, wherein said first heat spreader has two posts projecting therefrom and said second heat spreader has no through-hole posts.

41. The heat spreader apparatus of claim 37, wherein said plates are comprised of metal, a metal filled polymer material, and a ceramic material.

42. The heat spreader apparatus of claim 37, wherein said register apparatus on said at least one peripheral edge of each of said first heat spreader and said second heat spreader are configured for machine positioning and attachment to one of said at least two opposed major surfaces.

43. A heat spreader apparatus for an encapsulated semiconductor device having a row of exterior leads, a peripheral edge and two opposed major surfaces, the encapsulated semiconductor device having a register apparatus in the peripheral edge thereof, comprising:

a plate of heat conductive material cut to form two heat spreaders for substantially covering each of said two opposed major surfaces of said encapsulated semiconductor device, each of said heat spreaders having a lead edge proximate to said row of exterior leads, said two heat spreaders having at least two posts projecting therefrom for attachment to a substrate and aligning said row of exterior leads with respect to said substrate, said two heat spreaders configured to provide essentially the sole structural support for at least one of said row of exterior leads, said heat spreaders comprising register apparatus on at least one peripheral edge thereof for accurate mounting to said two opposed major surfaces, each of said register apparatus of said heat spreaders aligned with the register apparatus of the encapsulated semiconductor device to form a recess extending into the two opposed major surfaces and each of said heat spreaders; and wherein said two heat spreaders are positioned so as to provide an opening between distal end portions of said two heat spreaders.

44. The heat spreader apparatus of claim 43, wherein each of said two heat spreaders has two posts projecting therefrom.

45. The heat spreader apparatus of claim 43, wherein each of said two heat spreaders has one post projecting therefrom.

46. The heat spreader apparatus of claim 42, wherein each of said two heat spreaders is similar in shape for inverse attachment to one of said two opposed major surfaces.

47. The heat spreader apparatus of claim 43, wherein one of said at least two posts is positioned adjacent an end of said two heat spreaders.

48. The heat spreader apparatus of claim 43, wherein one of said heat spreaders has two posts projecting therefrom and the other of said heat spreaders has no through-hole posts.

49. The heat spreader apparatus of claim 45, wherein said plate comprises one of metal, metal filled polymer material, and ceramic material.

50. The heat spreader apparatus of claim 45, wherein said register apparatus formed on each of said two heat spreaders are configured for machine positioning and attachment of said two heat spreaders to said two opposed major surfaces.

51. A method for forming a semiconductor device comprising:

providing a semiconductor die connected to exterior leads extending therefrom;

encapsulating said semiconductor die in a material to form a package having opposing major surfaces, a peripheral edge having a register apparatus therein and a portion of said exterior leads connected to said semiconductor die projecting therefrom;

forming a pair of heat spreaders, said pair of heat spreaders having at least two posts extending therefrom for contacting at least a portion of a substrate, each heat spreader of said pair of heat spreaders configured to cover a portion of one of said opposing major surfaces, said heat spreaders providing essentialy a sole structural support for at least one of said exterior leads, said heat spreaders comprising register apparatus on at least one peripheral edge thereof for accurate mounting to said opposing major surfaces;

attaching said pair of heat spreaders to said opposing major surfaces of said package formed by said material encapsulating said semiconductor die by aligning each of said register apparatus of said heat spreaders with the register apparatus of said package to form a recess extending into said opposing major surfaces and each of said heat spreaders; and positioning said heat spreaders so as to provide an opening between distal end portions of said heat spreaders.

52. The method of claim 51, further comprising:

performing another encapsulation step to form a final package having portions of said pair of heat spreaders therein, said exterior leads and portions of said at least two posts extending from said final package.

53. The method of claim 51, further comprising:

providing a substrate having at least one electrical substrate lead formed thereon; and forming substrate areas in said substrate for insertion of said at least two posts therein to align said exterior leads with said at least one electrical substrate lead.

54. The method of claim 53, further comprising:

inserting said at least two posts into said substrate areas; and connecting said exterior leads to said at least one electrical substrate lead.

55. The method of claim 54, further comprising:

securing said at least two posts to said substrate areas with adhesive material.

56. The method of claim 51, further comprising:

electrically connecting at least one of said pair of heat spreaders to a ground bus.

57. The method of claim 56, wherein a post of said pair of heat spreaders is connected to said ground bus.

58. A method for forming a semiconductor device comprising:

forming a semiconductor die having exterior leads connected thereto;

encapsulating said semiconductor die with a material to form a package having two opposing major surfaces, a peripheral edge having a register apparatus therein and a portion of said exterior leads projecting therefrom;

forming a pair of heat spreaders, said pair of heat spreaders having at least two through-hole posts extending therefrom for contacting at least a portion of a substrate, each heat spreader of said pair of heat spreaders configured to substantially cover one of said opposing major surfaces of said package, said heat spreaders comprising register apparatus on at least on peripheral edge thereof for accurate mounting to said two opposing major surfaces;

attaching said heat spreaders to said opposing major surfaces of said package so as to provide essentially the sole structural support for at least one of said exterior leads, said attaching comprising aligning each of said register apparatus of said heat spreaders with said register apparatus of said package to form a recess extending into said two opposing major surfaces and each of said heat spreaders; and positioning said heat spreaders so as to provide an opening between distal end portions of said heat spreaders.

59. The method of claim 58, further comprising:

encapsulating portions of said pair of heat spreaders and portions of said package forming a final package, said exterior leads and through-hole posts extending from said final package.

60. The method of claim 58, further comprising:

providing a substrate having a plurality of electrical leads formed thereon; and forming through-holes in said substrate for insertion of said through-hole posts therein for aligning said exterior leads with said plurality of electrical substrate leads.

61. The method of claim 60, further comprising:
inserting said through-hole posts into said through-holes and attaching said exterior leads to said plurality of electrical substrate leads.

62. The method of claim 60, further comprising:
securing said through-hole posts in said through-holes with adhesive material.

63. The method of claim 58, further comprising:
conductively attaching at least one of said pair of heat spreaders to a ground bus.

64. The method of claim 60, further comprising:
connecting said through-hole post of said pair of heat spreaders to a ground bus located on said substrate.

65. A semiconductor device package, comprising:
a semiconductor die having electrical leads connected thereto, said semiconductor die encapsulated in a material forming a package, said package having opposing major external surfaces and having a package edge connecting said opposing major external surfaces and a portion of the electrical leads connected to said semiconductor die extending from said package edge, lead ends of said portion of electrical leads being configured for connection to a substrate, said package configured with register apparatus comprising a recess in at least one peripheral edge of said package, said recess extending to each of said opposing major external surfaces;

two heat spreaders, each heat spreader contacting at least a portion of said substrate and having a portion of said heat spreader attached to a portion of one of said opposing major external surfaces of said semiconductor die, thereby containing said semiconductor die between a portion of said heat spreaders, said two heat spreaders configured to provide essentially a sole structural support for at least one of said electrical leads, said heat spreaders positioned so as to leave an opening between distal end portions of said heat spreaders; and register apparatus on a peripheral edge of said heat spreaders for machine positioning and attachment of each heat spreader on one of said opposing major external surfaces of said package so that said register apparatus of said heat spreaders is alignable with said register apparatus of said package.

66. The semiconductor device package of claim 65, wherein said electrical leads are configured for vertical mounting of said semiconductor die on said substrate, and at least one of said heat spreaders has at least one through-hole post extending outwardly beyond said lead ends for connection to said substrate.

67. The semiconductor device package of claim 66, wherein one of said heat spreaders has a through-hole post proximate each end of said device for connection to said substrate, said substrate having apertures therein.

68. The semiconductor device package of claim 66, wherein a first heat spreader has at least one post proximate a first end of said semiconductor die, and a second heat spreader has at least one post proximate a second, opposite end of said semiconductor die.

69. The semiconductor device package of claim 65, wherein each of said heat spreaders substantially covers the attached portion of one of said major external surfaces of said semiconductor die.

70. The semiconductor device package of claim 67, wherein each of said heat spreaders substantially covers the attached portion of one of said opposing major external surfaces of said semiconductor die.

71. The semiconductor device package of claim 65, wherein said semiconductor die comprises a vertical mount plastic-encapsulated package.

72. The semiconductor device package of claim 65, wherein said register apparatus on a peripheral edge of each of said heat spreaders comprises cutout portions of each of said heat spreaders.

73. The semiconductor device package of claim 65, wherein said heat spreaders are attached to said package with an adhesive.

74. The semiconductor device package of claim 65, wherein said heat spreaders are attached to said package with an adhesive-coated tape.

75. The semiconductor device package of claim 65, wherein said heat spreaders comprise plates, said plates including metal, ceramic material, and plastic material.

76. The semiconductor device package of claim 65, further comprising:
a second layer of material encapsulating said heat spreaders within said package.

77. A method for forming a semiconductor device comprising:
forming a semiconductor die having exterior leads connected thereto;
encapsulating said semiconductor die with a material to form a package having two opposing major surfaces and a portion of said exterior leads projecting therefrom;
forming register apparatus on at least one peripheral edge of said package;
forming a pair of heat spreaders, said pair of heat spreaders having at least two through-hole posts extending therefrom, each heat spreader of said pair of heat spreaders configured to substantially cover one of said opposing major surfaces of said package;
forming register apparatus on said each heat spreader of said pair of heat spreaders, said register apparatus formed on at least one peripheral edge of said each heat spreader for machine positioning and attachment of said each heat spreader on one of said opposing major surfaces of said package;
attaching said heat spreaders to said opposing major surfaces of said package so as to provide essentially a sole structural support for at least one of said exterior leads, wherein said attaching comprises aligning each of said register apparatus of said heat spreaders with said register apparatus of said package to form a recess extending into said two opposing major surfaces and each of said heat spreaders; and
positioning said heat spreaders so as to provide an opening between distal end portions of said heat spreaders.

78. The method of claim 77, wherein forming said register apparatus on said at least one peripheral edge of said heat spreader comprises cutout portions of said each heat spreader of said pair of heat spreaders.

79. The method of claim 77, further comprising:
encapsulating portions of said pair of heat spreaders and portions of said package forming a final package, said exterior leads and through-hole posts extending from said final package.

80. The method of claim 77, further comprising:
providing a substrate having a plurality of electrical substrate leads formed thereon; and
forming through-holes in said substrate for insertion of said through-hole posts therein for aligning said exterior leads with said plurality of electrical substrate leads.

81. The method of claim 80, further comprising:
inserting said through-hole posts into said through-holes and attaching said exterior leads to said plurality of electrical substrate leads.

82. The method of claim 80, further comprising:
securing said through-hole posts in said through-holes with adhesive material.

83. The method of claim 77, further comprising:
conductively attaching at least one of said pair of heat spreaders to a ground bus.

84. The method of claim 80, further comprising:
connecting a through-hole post of said pair of heat spreaders to a ground bus located on said substrate.

85. A semiconductor device package, comprising:
a semiconductor die having electrical lads connected thereto, said semiconductor die encapsulated in a maerial forming a package, said package having opposing major external surfaces and having four minor edge surfaces connecting said opposing major external surfaces, said package configured with register apparatus comprising a recess in at least one peripheral edge of said package, said recess extending to each of said opposing major external surfaces;
a portion of the electrical leads connected to said semiconductor die extending from one of said minor edge surfaces, lead ends of said portion of the electrical leads being configured for connection to a substrate;
two heat spreaders, each heat spreader having a portion thereof attached to a portion of one of said opposing major external surfaces of said semiconductor die thereby containing said semiconductor die between a portion of said heat spreaders, said two heat spreaders configured to provide essentially a sole structural support for at least one of said electrical leads, said two heat spreaders positioned so as to provide an opening between distal end portions of said heat spreaders, said heat spreaders comprising register apparatus on at least one peripheral edge of each of said heat spreaders for alignment with the register apparatus of said package; and
wherein said minor edge surfaces have no heat dissipating structures attached thereon.

86. The semiconductor device package of claim 85, wherein said electrical leads are configured for vertical mounting of said semiconductor die on said substrate, and at least one of said heat spreaders has at least one through-hole post extending outwardly beyond said lead ends for connection to said substrate.

87. The semiconductor device package of claim 86, wherein one of said heat spreaders has a through-hole post proximate each end of said semiconductor die for connection to said substrate, said substrate having apertures therein.

88. The semiconductor device package of claim 86, wherein a first heat spreader has at least one post proximate a first end of said semiconductor die, and a second heat spreader has at least one post proximate a second, opposite end of said semiconductor die.

89. The semiconductor device package of claim 85, wherein each of said heat spreaders substantially covers the attached portion of one of said opposing major external surfaces of said semiconductor die.

90. The semiconductor device package of claim 85, wherein at least one of said heat spreaders is configured for connection to a ground conductor on said substrate.

91. The semiconductor device package of claim 85, wherein said semiconductor die comprises a vertical mount plastic-encapsulated package.

92. The semiconductor device package of claim 85, wherein said register apparatus on at least one peripheral edge of each of said heat spreaders are configured for machine positioning and attachment of each heat spreader on one of said opposing major external surfaces of said package.

93. The semiconductor device package of claim 92, wherein said register apparatus on a peripheral edge of each of said heat spreaders comprises cutout portions of each of said heat spreaders.

94. The semiconductor device package of claim 85, wherein said heat spreaders are attached to said package with an adhesive.

95. The semiconductor device package of claim 85, wherein said heat spreaders are attached to said package with an adhesive-coated tape.

96. The semiconductor device package of claim 85, wherein said heat spreaders comprise plates, said plates including metal, ceramic material, and plastic material.

97. The semiconductor device package of claim 85, further comprising:
a second layer of material encapsulating said heat spreaders within said package.

98. A method for forming a semiconductor device comprising:
forming a semiconductor die having exterior leads connected thereto;
encapsulating said semiconductor die with a material to form a package having two opposing major surfaces and four minor edge surfaces connecting said opposing major surfaces, said package having a portion of said exterior leads projecting from one of said minor edge surfaces;
forming register apparatus on at least one peripheral edge of said package;
forming a pair of heat spreaders, said pair of heat spreaders having at least two through-hole posts extending therefrom for contacting at least a portion of a substrate, each heat spreader of said pair of heat spreaders configured to substantially cover one of said opposing major surfaces of said package;
forming register apparatus on each heat spreader of said pair of heat spreaders, said register apparatus formed on at least one peripheral edge of said each heat spreader;
attaching said heat spreaders to said opposing major surfaces of said package so as to provide essentially a sole structural support for at least one of said exterior leads, wherein said attaching comprises aligning each of said register apparatus of said heat spreaders with said register apparatus of said package to form a recess extending into said two opposing major surfaces and each of said heat spreaders;
positioning said heat spreaders so as to provide an opening between distal end portions of said heat spreaders; and
wherein said minor edge surfaces have no heat dissipating structures attached thereon.

99. The method of claim 98, further comprising:

encapsulating portions of said pair of heat spreaders and portions of said package forming a final package, said exterior leads and through-hole posts extending from said final package.

100. The method of claim 98, further comprising:

providing a substrate having a plurality of electrical substrate leads formed thereon; and forming through-holes in said substrate for insertion of said through-hole posts therein for aligning said exterior leads with said plurality of electrical substrate leads.

101. The method of claim 100, further comprising:

inserting said through-hole posts into said through-holes and attaching said exterior leads to said plurality of electrical substrate leads.

102. The method of claim 100, further comprising:

securing said through-hole posts in said through-holes with adhesive material.

103. The method of claim 98, further comprising:

conductively attaching at least one of said pair of heat spreaders to a ground bus.

104. The method of claim 100, further comprising:

connecting a through-hole post of said pair of heat spreaders to a ground bus located on said substrate.

105. The method of claim 98, wherein said forming register apparatus on at least one peripheral edge of said each heat spreader of said pair of heat spreaders is for machine positioning and attachment of each heat spreader on one of said opposing major surfaces of said package.

106. The method of claim 105, wherein said forming register apparatus on at least one peripheral edge of said each heat spreader comprises cutout portions of each heat spreader of said pair of heat spreaders.

\* \* \* \* \*

UNITED STATES PATENT AND TRADEMARK OFFICE
CERTIFICATE OF CORRECTION

PATENT NO. : 6,326,687 B1  
DATED : December 4, 2001  
INVENTOR(S) : David J. Corisis It is certified that error appears in the above-identified patent and that said Letters Patent is hereby corrected as shown below:

Drawings,
Figure 7A, delete the lowest occurrences of "60" and "48" and insert -- 48 -- to properly identify the location the post end
Figure 8A, delete "60"

Column 2,
Line 21, after "rates" and before "protection" insert -- and --

Column 5,
Line 13, after "circuit" and before "78" insert -- trace --
Line 17, change "circuits 78" to -- circuit traces 78 --
Line 30, after "heat" and before "20C" insert -- spreader --
Line 49, change "ground lead" to -- surface trace --
Line 57, change "circuits" to -- circuit traces --

Column 6,
Line 1, change "Fi" to -- If --
Line 4, after "encapsulant" and before "may" insert -- will enclose a major portion of each heat spreader 20, 22, whereby only the exterior leads 36 and the through-hole posts 40 project from the encapsulant. The second layer 84 of encapsulant --

Column 7,
Line 32, change "positionin" the -- positioning -- and change "that" to -- heat --

Column 8,
Line 59, change "conductor" to -- conductive --

Column 10,
Line 21, change "firs" to -- first --

Column 12,
Line 46, after "least" change "on" to -- one --

Column 13,
Line 41, after "of" and before "said" insert -- each of --
Line 64, after "said" and before "major" insert -- opposing --
Lines 66-67, change "The semiconductor device package of claim 67, wherein each of said heat spreaders substantially covers the" to -- The semiconductor device of claim 65, wherein at least one of said heat spreaders is configured for connection to a ground conductor on said substrate. --

UNITED STATES PATENT AND TRADEMARK OFFICE
CERTIFICATE OF CORRECTION

PATENT NO.      : 6,326,687 B1
DATED           : December 4, 2001
INVENTOR(S)     : David J. Corisis It is certified that error appears in the above-identified patent and that said Letters Patent is hereby corrected as shown below:

Column 14,
Lines 1-2, delete the lines in their entirety
Line 55, after "said" and before "heat" insert -- each --

Signed and Sealed this

Sixteenth Day of December, 2003

JAMES E. ROGAN
*Director of the United States Patent and Trademark Office*